US012631680B2

(12) United States Patent
Zhu et al.

(10) Patent No.: US 12,631,680 B2
(45) Date of Patent: May 19, 2026

(54) TESTING STRUCTURE AND TESTING METHOD FOR LOCATING SOURCE OF PLASMA DAMAGE

(71) Applicant: Shanghai Huali Microelectronics Corporation, Shanghai (CN)

(72) Inventors: Yekai Zhu, Shanghai (CN); Yueqin Zhu, Shanghai (CN); Ke Zhou, Shanghai (CN)

(73) Assignee: Shanghai Huali Microelectronics Corporation, Shanghai (CN)

( * ) Notice: Subject to any disclaimer, the term of this patent is extended or adjusted under 35 U.S.C. 154(b) by 171 days.

(21) Appl. No.: 18/810,413

(22) Filed: Aug. 20, 2024

(65) Prior Publication Data

US 2026/0002979 A1 Jan. 1, 2026

(51) Int. Cl.
*G01R 31/28* (2006.01)
*H10P 74/00* (2026.01)
*H10P 74/20* (2026.01)

(52) U.S. Cl.
CPC ........ *G01R 31/2851* (2013.01); *H10P 74/203* (2026.01); *H10P 74/273* (2026.01)

(58) Field of Classification Search
CPC .. G01R 31/2851; H10P 74/203; H10P 74/273

USPC .................................................. 324/762.01
See application file for complete search history.

(56) References Cited

U.S. PATENT DOCUMENTS 6,353,235 B1 * 3/2002 Watanabe ............. H10P 74/277
438/18

* cited by examiner

*Primary Examiner* — Roberto Velez
(74) *Attorney, Agent, or Firm* — Quarles & Brady LLP

(57) ABSTRACT

This application discloses a testing structure for locating a source of a plasma damage. A testing substructure corresponding to a selected metal layer includes a first MOS transistor, a first gate lead, a first antenna and a monitoring gate pad. The first gate lead is composed of a metal wire of the selected metal layer. The first antenna is connected with the first gate lead. The first gate lead is connected with a first gate conductive material layer of the first MOS transistor. The first antenna, the first gate lead and the first gate conductive material layer form a first pathway for accumulating plasma charges towards a surface of a first gate dielectric layer. The monitoring gate pad is connected with the first gate lead. This application further discloses a testing method for locating a source of a plasma damage. This application can locate the source of the plasma damage.

17 Claims, 2 Drawing Sheets

TESTING STRUCTURE AND TESTING METHOD FOR LOCATING SOURCE OF PLASMA DAMAGE

CROSS-REFERENCES TO RELATED APPLICATIONS

This application claims priority to Chinese patent application No. CN202410867366.2, filed on Jun. 28, 2024, the disclosure of which is incorporated herein by reference in its entirety.

TECHNICAL FIELD

This application relates to the field of semiconductor integrated circuit manufacturing, in particular to a testing structure for locating a source of a plasma damage. This application further relates to a testing method for locating a source of a plasma damage.

BACKGROUND

Plasma etching technology has the advantages of good directionality, low temperature requirement, and simple process, and is widely used in the field of integrated circuit manufacturing, such as via etching, bocking layer etching and photoresist ashing in metal interconnect processes. As the circuit size continues to shrink, the length and density of connecting lines in the chip continue to increase, and the number of metal wiring layers also rapidly increases. Due to the difficulty in ensuring the uniformity of plasmas, charges generated by the non-uniformity run along the metal interconnect to the bottom of the gate, leading to the accumulation of charges and damage to the gate dielectric. Unreasonable wiring density and uneven plasma radiation will exacerbate the damage of plasmas to the gate dielectric. Therefore, it is necessary to design a testing structure that can monitor layer by layer and locate a source of a plasma damage in the metal interconnect layer.

Referring to FIG. 1, it illustrates a schematic structural diagram of a device when a gate dielectric layer is damaged in an existing plasma etching process. A gate structure is formed on a semiconductor substrate. The gate structure includes a gate dielectric layer 102 and a gate conductive material layer 103 which are sequentially stacked. An interlayer film 101 covers the gate structure.

A metal layer 104 is formed on a top surface of the interlayer film 101.

In an existing method, pattern etching of the metal layer 104 includes the following steps:

coating a photoresist 105, and exposing and developing the photoresist 105 to form a pattern of the photoresist 105;

then performing plasma etching by using the pattern of the photoresist 105 as a mask, where the pattern of the photoresist 105 will be gradually transferred to the metal layer 104 as the etching is performed. FIG. 1 illustrates a structure during plasma etching, from which it can be seen that a bar 104a is a pattern formed after etching a top part of the metal layer 104; with further etching, a bottom part of the metal layer 104 will be gradually etched off and penetrated.

FIG. 1 further illustrates positive charges 106a and negative charges 106b focused by plasmas. From arrows 107, it can be seen that areas traversed by the arrows 107 are conductors, thus forming a charge movement pathway.

Charged charges can easily transfer into the gate dielectric layer 102 along the pathway, causing a damage to the gate dielectric layer 102.

BRIEF SUMMARY

According to some embodiments in this application, a testing structure for locating the source of the plasma damage provided in this application includes a testing substructure corresponding to a selected metal layer.

The testing substructure includes a first MOS transistor, a first gate lead, a first antenna and a monitoring gate pad.

The first MOS transistor includes a first gate structure, a first source area and a first drain area. The first gate structure includes a first gate dielectric layer and a first gate conductive material layer.

The first gate lead is composed of a metal wire of the selected metal layer.

The first antenna is connected with the first gate lead.

The first gate lead is connected with the first gate conductive material layer.

Plasmas are adopted in pattern etching of the selected metal layer. The first antenna, the first gate lead and the first gate conductive material layer form a first pathway for accumulating plasma charges towards a surface of the first gate dielectric layer in the pattern etching of the selected metal layer. The first pathway is an amplification pathway with the first antenna. The first antenna is configured to increase absorption of the plasma charges and amplify the damage caused by the plasma charges to the first gate dielectric layer.

The monitoring gate pad is connected with the first gate lead. The monitoring gate pad is configured to test gate current of the first MOS transistor. The gate current of the first MOS transistor is used for monitoring the amount of the damage caused by the plasma charges in the pattern etching of the selected metal layer to the first gate dielectric layer.

In some cases, a top of the first gate conductive material layer includes a plurality of metal layers. Each metal layer is provided with one corresponding testing substructure. The first gate leads correspond to the metal layers one to one.

In some cases, in the testing substructure corresponding to the selected metal layer, the first antenna is composed of the metal wire of the selected metal layer, or the first antenna is formed by connecting the metal wire of the selected metal layer with the metal wires of a plurality of metal layers below the selected metal layer.

In some cases, in the testing substructure corresponding to the selected metal layer, all metal wires in the first antenna are in a snakelike connection structure.

In some cases, the testing structure further includes a testing reference structure.

The testing reference structure includes a second MOS transistor, a second gate lead and a reference gate pad.

The second MOS transistor includes a second gate structure, a second source area and a second drain area. The second gate structure includes a second gate dielectric layer and a second gate conductive material layer.

The second gate lead is formed by connecting the metal wires of more than one metal layers. The second gate lead is connected with the second gate conductive material layer. In the pattern etching of each metal layer corresponding to the second gate lead, the second gate lead and the first gate conductive material layer form a second pathway for accumulating the plasma charges towards a surface of the second gate dielectric layer. The second pathway is a reference pathway without an antenna.

The reference gate pad is connected with the second gate lead. The reference gate pad is configured to test gate current of the second MOS transistor. The gate current of the second MOS transistor is used for being compared with the gate current of the first MOS transistor of the selected metal layer to monitor the amount of the damage caused by the plasma charges in the pattern etching of the selected metal layer to the first gate dielectric layer.

In some cases, the gate current of the first MOS transistor of the selected metal layer and the gate current of the second MOS transistor are used for calculating a first ratio. The first ratio is a ratio of the gate current of the first MOS transistor of the selected metal layer to the gate current of the second MOS transistor. The first ratio is used for monitoring the amount of the damage caused by the plasma charges in the pattern etching of the selected metal layer to the first gate dielectric layer. The larger the first ratio, the greater the amount of the damage caused by the plasma charges in the pattern etching of the selected metal layer to the first gate dielectric layer.

In some cases, each first MOS transistor and the second MOS transistor are respectively formed in independent active areas.

The active areas of each first MOS transistor and the second MOS transistor are arranged in parallel and aligned. Length edges of the active areas of each first MOS transistor and the second MOS transistor are in parallel and along a channel width direction.

Each first gate conductive material layer and the second gate conductive material layer are arranged in parallel. Each first gate lead and the second gate lead are arranged in parallel.

Each first gate lead is provided with a first jumper. The first jumper is located between a connecting end of the first antenna and the first gate lead and a connecting end of the monitoring gate pad and the first gate lead.

The second gate lead is provided with a second jumper. The second jumper is located between a connecting end of the second gate lead and the second reference gate pad and a connecting end of the second gate lead and the second gate conductive material layer.

In some cases, the first source area of each first MOS transistor and the second source area of the second MOS transistor are connected to the same source pad through a source lead composed of a metal wire.

The first drain area of each first MOS transistor and the second drain area of the second MOS transistor are connected to the same drain pad through a drain lead composed of a metal wire.

A substrate electrode of each first MOS transistor and a substrate electrode of the second MOS transistor are connected to the same substrate pad through a substrate electrode lead composed of a metal wire.

A first protective diode is further provided on a path of each first gate lead. The first protective diode is located between a connecting end of the monitoring gate pad and the first gate lead and a connecting end of connecting lines of the first gate lead and the substrate pad.

A second protective diode is further provided on a path of each second gate lead. The second protective diode is located between a connecting end of the reference gate pad and the second gate lead and a connecting end of connecting lines of the second gate lead and the substrate pad.

In some cases, each monitoring gate pad, the source pad, the drain pad, the substrate pad and the reference gate pad are arranged in the same row.

In order to solve the above technical problem, a testing structure adopted in the testing method for locating the source of the plasma damage provided in this application includes a testing substructure corresponding to a selected metal layer.

The testing substructure includes a first MOS transistor, a first gate lead, a first antenna and a monitoring gate pad.

The first MOS transistor includes a first gate structure, a first source area and a first drain area. The first gate structure includes a first gate dielectric layer and a first gate conductive material layer.

The first gate lead is composed of a metal wire of the selected metal layer.

The first antenna is connected with the first gate lead.

The first gate lead is connected with the first gate conductive material layer.

Plasmas are adopted in pattern etching of the selected metal layer. The first antenna, the first gate lead and the first gate conductive material layer form a first pathway for accumulating plasma charges towards a surface of the first gate dielectric layer in the pattern etching of the selected metal layer. The first pathway is an amplification pathway with the first antenna. The first antenna is configured to increase absorption of the plasma charges and amplify the damage caused by the plasma charges to the first gate dielectric layer.

The monitoring gate pad is connected with the first gate lead.

The testing method includes:

testing gate current of the first MOS transistor through the monitoring gate pad; and monitoring the amount of the damage caused by the plasma charges in the pattern etching of the selected metal layer to the first gate dielectric layer by using the gate current of the first MOS transistor.

In some cases, a top of the first gate conductive material layer includes a plurality of metal layers. Each metal layer is provided with one corresponding testing substructure. The first gate leads correspond to the metal layers one to one.

In some cases, in the testing substructure corresponding to the selected metal layer, the first antenna is composed of the metal wire of the selected metal layer, or the first antenna is formed by connecting the metal wire of the selected metal layer with the metal wires of a plurality of metal layers below the selected metal layer.

In some cases, in the testing substructure corresponding to the selected metal layer, all metal wires in the first antenna are in a snakelike connection structure.

In some cases, the testing structure further includes a testing reference structure.

The testing reference structure includes a second MOS transistor, a second gate lead and a reference gate pad.

The second MOS transistor includes a second gate structure, a second source area and a second drain area. The second gate structure includes a second gate dielectric layer and a second gate conductive material layer.

The second gate lead is formed by connecting the metal wires of more than one metal layers. The second gate lead is connected with the second gate conductive material layer.

In the pattern etching of each metal layer corresponding to the second gate lead, the second gate lead and the first gate conductive material layer form a second pathway for accumulating the plasma charges towards a surface of the second gate dielectric layer. The second pathway is a reference pathway without an antenna.

The reference gate pad is connected with the second gate lead.

The testing method includes:

testing gate current of the second MOS transistor through the reference gate pad; and monitoring the amount of the damage caused by the plasma charges in the pattern etching of the selected metal layer to the first gate dielectric layer by comparing the gate current of the first MOS transistor of the selected metal layer with the gate current of the second MOS transistor.

In some cases, in the testing method, the step of comparing the gate current of the first MOS transistor of the selected metal layer with the gate current of the second MOS transistor includes:

calculating a first ratio of the gate current of the first MOS transistor of the selected metal layer to the gate current of the second MOS transistor, the first ratio being used for monitoring the amount of the damage caused by the plasma charges in the pattern etching of the selected metal layer to the first gate dielectric layer, the larger the first ratio, the greater the amount of the damage caused by the plasma charges in the pattern etching of the selected metal layer to the first gate dielectric layer.

In some cases, each first MOS transistor and the second MOS transistor are respectively formed in independent active areas.

The active areas of each first MOS transistor and the second MOS transistor are arranged in parallel and aligned. Length edges of the active areas of each first MOS transistor and the second MOS transistor are in parallel and along a channel width direction.

Each first gate conductive material layer and the second gate conductive material layer are arranged in parallel. Each first gate lead and the second gate lead are arranged in parallel.

Each first gate lead is provided with a first jumper. The first jumper is located between a connecting end of the first antenna and the first gate lead and a connecting end of the monitoring gate pad and the first gate lead.

The second gate lead is provided with a second jumper. The second jumper is located between a connecting end of the second gate lead and the second reference gate pad and a connecting end of the second gate lead and the second gate conductive material layer.

In some cases, the first source area of each first MOS transistor and the second source area of the second MOS transistor are connected to the same source pad through a source lead composed of a metal wire.

The first drain area of each first MOS transistor and the second drain area of the second MOS transistor are connected to the same drain pad through a drain lead composed of a metal wire.

A substrate electrode of each first MOS transistor and a substrate electrode of the second MOS transistor are connected to the same substrate pad through a substrate electrode lead composed of a metal wire.

A first protective diode is further provided on a path of each first gate lead. The first protective diode is located between a connecting end of the monitoring gate pad and the first gate lead and a connecting end of connecting lines of the first gate lead and the substrate pad.

A second protective diode is further provided on a path of each second gate lead. The second protective diode is located between a connecting end of the reference gate pad and the second gate lead and a connecting end of connecting lines of the second gate lead and the substrate pad.

each monitoring gate pad, the source pad, the drain pad, the substrate pad and the reference gate pad are arranged in the same row.

In this application, a testing substructure corresponding to a selected metal layer is provided, a first antenna is provided in the testing substructure, and the first antenna is provided in a first pathway for accumulating the plasma charges in the pattern etching of the selected metal layer towards a surface of the first gate dielectric layer, thus making the first pathway an amplification pathway, so that the damage caused by the plasma charges to the first dielectric layer of the testing substructure can be amplified, and the amount of the damage to the first gate dielectric layer can be obtained from the gate current of the first MOS transistor tested by the monitoring gate pad. Therefore, this application can determine the amount of the damage to the first gate dielectric layer of the first MOS transistor by testing the gate current of the first MOS transistor, thus determining whether the plasmas in the pattern etching of the selected metal layer are the source of the plasma damage to the gate dielectric layer. Therefore, this application can monitor whether the pattern etching of the selected metal layer will form the source of the plasma damage to the corresponding gate dielectric layer, thus locating the source of the plasma damage.

In this application, a plurality of testing substructures may be further provided, so that each metal layer is provided with one corresponding testing substructure, thus monitoring whether each metal layer is a source of a plasma damage. Therefore, this application can quickly identify the metal layers which are sources of plasma damages from all metal layers.

In this application, a testing reference structure may be further provided. A second pathway for accumulating the plasma charges towards a surface of the second dielectric layer in the testing reference structure is a reference pathway without an antenna that cannot achieve amplification. The source of the plasma damage can be quickly located by comparing the gate current of the first MOS transistor with the gate current of the second MOS transistor of the testing reference structure.

BRIEF DESCRIPTION OF THE DRAWINGS

This application will be further described below in detail in combination with the specific embodiments with reference to the drawings.

DETAILED DESCRIPTION OF THE EMBODIMENTS

Figure 1:
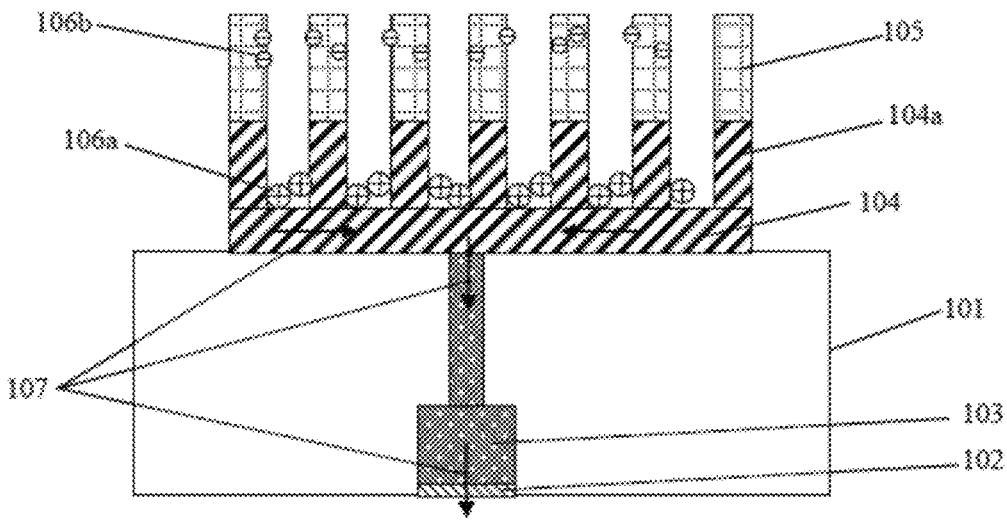
FIG. 1 it illustrates a schematic structural diagram of a device when a gate dielectric layer is damaged in an existing plasma etching process.
Figure 2:
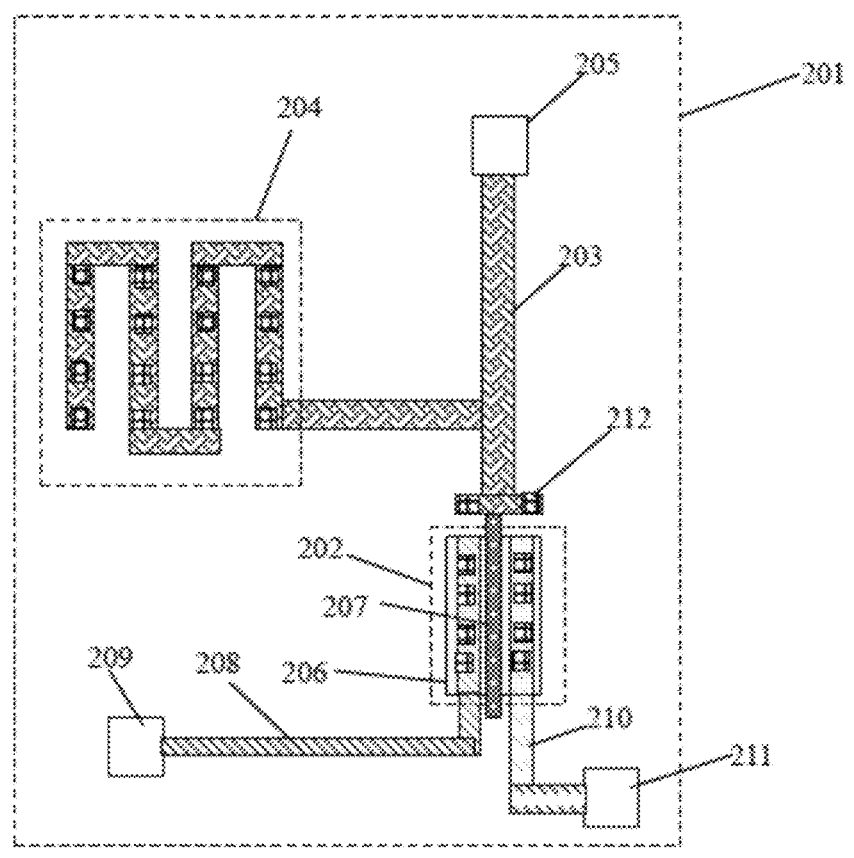
FIG. 2 illustrates a schematic structural diagram of a testing substructure of a testing structure for locating a source of a plasma damage according to an embodiment of this application.

Referring to FIG. 2, which illustrates a schematic structural diagram of a testing substructure 201 of a testing structure 301 for locating a source of a plasma damage according to an embodiment of this application, the testing structure 301 for locating the source of the plasma damage according to this embodiment of this application includes a testing substructure 201 corresponding to a selected metal layer.

The testing substructure 201 includes a first MOS transistor 202, a first gate lead 203, a first antenna 204 and a monitoring gate pad 205.

The first MOS transistor 202 includes a first gate structure, a first source area and a first drain area. The first gate structure includes a first gate dielectric layer and a first gate conductive material layer 207. In some embodiments, the first gate conductive material layer 207 is a poly gate or a metal gate.

The first MOS transistor 202 is formed in a corresponding active area 206. The first source area and the first drain area are self-aligned and formed in the active area 206 on two sides of the first gate conductive material layer 207.

The first gate lead 203 is composed of a metal wire of the selected metal layer.

The first antenna 204 is connected with the first gate lead 203.

In this embodiment of this application, all metal wires in the first antenna 204 are in a snakelike connection structure. In other embodiments, other suitable connection structures may also be adopted to form the first antenna 204.

The first gate lead 203 is connected with the first gate conductive material layer 207.

Plasmas are adopted in pattern etching of the selected metal layer. The first antenna 204, the first gate lead 203 and the first gate conductive material layer 207 form a first pathway for accumulating plasma charges towards a surface of the first gate dielectric layer in the pattern etching of the selected metal layer. The first pathway is an amplification pathway with the first antenna 204. The first antenna 204 is configured to increase absorption of the plasma charges and amplify the damage caused by the plasma charges to the first gate dielectric layer.

The monitoring gate pad 205 is connected with the first gate lead 203. The monitoring gate pad 205 is configured to test gate current of the first MOS transistor 202. The gate current of the first MOS transistor 202 is used for monitoring the amount of the damage caused by the plasma charges in the pattern etching of the selected metal layer to the first gate dielectric layer.

Figure 3:
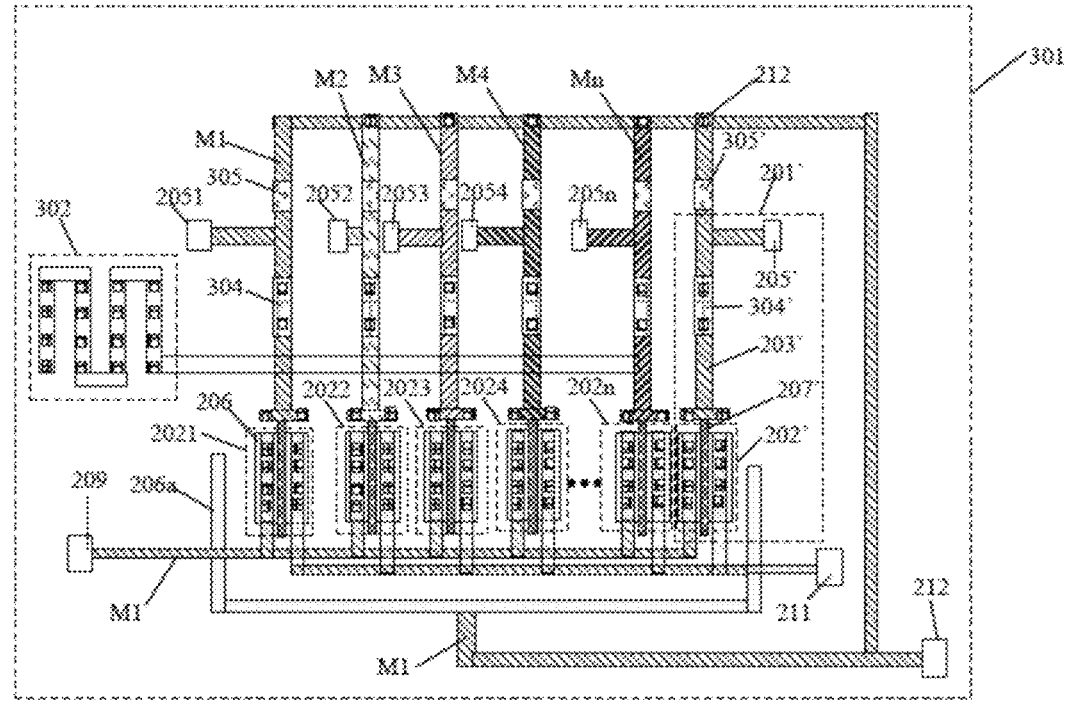
FIG. 3 illustrates a schematic structural diagram of a testing structure for locating a source of a plasma damage according to an exemplary embodiment of this application.

A top of the first gate conductive material layer 207 includes a plurality of metal layers. Referring to FIG. 3, it illustrates a schematic structural diagram of a testing structure 301 for locating a source of a plasma damage according to an embodiment of this application. In an exemplary embodiment of this application, each metal layer is provided with one corresponding testing substructure 201, and the first gate leads 203 correspond to the metal layers one to one. In other embodiments, the metal layers that easily cause plasma damages may also be preliminarily selected, and the selected metal layers are only a part of all metal layers. A corresponding testing substructure 201 is provided for each selected metal layer, and no corresponding testing substructure 201 is provided for each unselected metal layer.

FIG. 3 illustrates the entire testing structure 301 according to this exemplary embodiment of this application. In FIG. 3, it includes n metal layers, which are sequentially marked as M1, M2, M3, M4 . . . Mn. Each metal layer is provided with one testing substructure 201. In FIG. 3, in an arrangement order of M1, M2, M3, M4 . . . Mn, n monitoring gate pads are sequentially marked as 2051, 2052, 2053, 2054 . . . 205n, and n first MOS transistors are sequentially marked as 2021, 2022, 2023, 2024 . . . 202n. In FIG. 3, there are n corresponding first gate leads 203 as illustrated in FIG. 2, which respectively correspond to the metal wires of the metal layers M1, M2, M3, M4 . . . Mn.

In FIG. 3, there are a total of n first antennas 204 as illustrated in FIG. 2 in a dashed box 302, each of which is connected with the first gate lead 203 of the corresponding metal layer. FIG. 3 shows that the n first antennas 204 are formed in the same area, i.e., the area as illustrated by the dashed box 302, but the n first antennas 204 are not located on the same metal layer. Therefore, in the cross-sectional structure, the n first antennas 204 are separate, that is, they are independent. Each first antenna 204 is composed of a metal wire of the selected metal layer. Similarly, the n first gate leads 203 described above are also independent of each other and correspond to the corresponding metal layers one to one. Only in this way can each testing substructure 201 correspond to one metal layer, so that each testing substructure 201 can test whether the plasma etching process of the corresponding metal layer is a source of a damage. In other embodiments, all first antennas 204 may also be not located in the same area. In this case, in some embodiments, each first antenna 204 is composed of a metal wire of the selected metal layer. In other embodiments, the first antenna 204 may also be formed by connecting the metal wire of the selected metal layer with the metal wires of a plurality of metal layers below the selected metal layer. The metal wires of the plurality of metal layers need to be connected through a via 212.

In an exemplary embodiment of this application, referring to FIG. 3, the testing structure further includes a testing reference structure 201'.

The testing reference structure 201' includes a second MOS transistor 202', a second gate lead 203' and a reference gate pad 205'. Compared with the testing substructure 201 in FIG. 2, the testing reference structure 201' is not provided with an antenna.

The second MOS transistor 202' includes a second gate structure, a second source area and a second drain area. The second gate structure includes a second gate dielectric layer and a second gate conductive material layer 207'.

The second MOS transistor 202' is formed in a corresponding active area 206. The first source area and the first drain area are self-aligned and formed in the active area 206 on two sides of the second gate conductive material layer 207'.

The second gate lead 203' is formed by connecting the metal wires of more than one metal layers. The second gate lead 203' is connected with the second gate conductive material layer 207'. In the pattern etching of each metal layer corresponding to the second gate lead 203', the second 203' gate lead and the first gate conductive material layer 207 form a second pathway for accumulating the plasma charges towards a surface of the second gate dielectric layer. The second pathway is a reference pathway without an antenna.

The reference gate pad 205' is connected with the second gate lead 203'. The reference gate pad 205' is configured to test gate current of the second MOS transistor 202'. The gate current of the second MOS transistor 202' is used for being compared with the gate current of the first MOS transistor 202 of the selected metal layer to monitor the amount of the damage caused by the plasma charges in the pattern etching of the selected metal layer to the first gate dielectric layer. In some cases, the gate current of the first MOS transistor 202 of the selected metal layer and the gate current of the second MOS transistor 202' are used for calculating a first ratio. The first ratio is a ratio of the gate current of the first MOS transistor 202 of the selected metal layer to the gate current of the second MOS transistor 202'. The first ratio is used for monitoring the amount of the damage caused by the plasma charges in the pattern etching of the selected metal layer to the first gate dielectric layer. The larger the first ratio, the greater the amount of the damage caused by the plasma charges in the pattern etching of the selected metal layer to the first gate dielectric layer.

Referring to FIG. 3, each first MOS transistor, i.e., each first MOS transistor corresponding to reference signs 2021, 2022, 2023, 2024 . . . 202n, and the second MOS transistor 202' are respectively formed in independent active areas 206. The active areas 206 of each first MOS transistor 202 and the second MOS transistor 202' are arranged in parallel and aligned. Length edges of the active areas 206 of each first MOS transistor 202 and the second MOS transistor 202' are in parallel and along a channel width direction.

Each first gate conductive material layer 207 and the second gate conductive material layer 207' are arranged in parallel. Each first gate lead 203 and the second gate lead 203' are arranged in parallel. From FIG. 3, it can be seen that the structure that the active area 206, each first gate conductive material layer 207 and the second gate conductive material layer 207 ', and each first gate lead 203 and the second gate lead 203' are arranged in parallel forms an array structure.

In some embodiments, referring to FIG. 3, each first gate lead 203 is provided with a first jumper 304. The first jumper 304 is located between a connecting end of the first antenna 204 and the first gate lead 203 and a connecting end of the monitoring gate pad 205 and the first gate lead 203.

The second gate lead 203' is provided with a second jumper 304'. The second jumper 304' is located between a connecting end of the second gate lead 203' and the second reference gate pad 205' and a connecting end of the second gate lead 203' and the second gate conductive material layer 207'.

In some embodiments, referring to FIG. 3, the first source area of each first MOS transistor 202 and the second source area of the second MOS transistor 202' are connected to the same source pad 209 through a source lead composed of a metal wire. In FIG. 3, the source lead is composed of the metal wire of the metal layer M1.

The first drain area of each first MOS transistor 202 and the second drain area of the second MOS transistor 202' are connected to the same drain pad 211 through a drain lead composed of a metal wire. In FIG. 3, the drain lead is composed of the metal wire of the metal layer M2.

A substrate electrode of each first MOS transistor 202 and a substrate electrode of the second MOS transistor 202' are connected to the same substrate pad 212 through a substrate electrode lead composed of a metal wire. In FIG. 3, each active area 206 is isolated on the semiconductor substrate through shallow trench isolation. FIG. 3 also illustrates another active area 206a adjacent to each active area 206. The other active area 206a is communicated with the active area 206. A contact or via 212 is formed in a top of the other active area 206a, which is connected with the substrate electrode lead and is finally connected to the substrate pad 212. In FIG. 3, the substrate electrode lead is composed of the metal wire of the metal layer M1.

In some embodiments, referring to FIG. 3, a first protective diode 305 is further provided on a path of each first gate lead 203. The first protective diode 305 is located between a connecting end of the monitoring gate pad 205 and the first gate lead 203 and a connecting end of connecting lines of the first gate lead 203 and the substrate pad 212.

A second protective diode 305' is further provided on a path of each second gate lead 203'. The second protective diode 305' is located between a connecting end of the reference gate pad 205' and the second gate lead 203' and a connecting end of connecting lines of the second gate lead 203' and the substrate pad 212.

Figure 4:
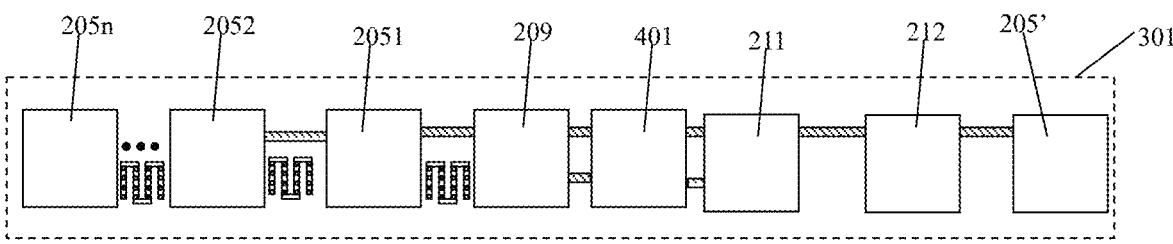
FIG. 4 illustrates a schematic structural diagram of arrangement of pads of a testing structure for locating a source of a plasma damage according to an exemplary embodiment of this application.

Referring to FIG. 4, which illustrates a schematic structural diagram of arrangement of pads of a testing structure 301 for locating a source of a plasma damage according to an embodiment of this application, each monitoring gate pad 205, the source pad 209, the drain pad 211, the substrate pad 212 and the reference gate pad 205' are arranged in the same row. FIG. 4 also illustrates that the first antennas 204 corresponding to the testing substructures 201 are separately provided in different areas. In FIG. 4, box 401 represents an array structure formed by arranging the first MOS transistor 202 and the first gate lead 203 corresponding to each testing substructure 201 in FIG. 3, and the second MOS transistor 202' and the second gate lead 203' of the testing reference structure 201'. From FIG. 4, it can be seen that during testing, it is only necessary to add appropriate electrical signals to the corresponding pads and read the corresponding electrical signals.

In this embodiment of this application, a testing substructure 201 corresponding to a selected metal layer is provided, a first antenna 204 is provided in the testing substructure 201, and the first antenna 204 is provided in a first pathway for accumulating the plasma charges in the pattern etching of the selected metal layer towards a surface of the first gate dielectric layer, thus making the first pathway an amplification pathway, so that the damage caused by the plasma charges to the first dielectric layer of the testing substructure 201 can be amplified, and the amount of the damage to the first gate dielectric layer can be obtained from the gate current of the first MOS transistor 202 tested by the monitoring gate pad 205. Therefore, this embodiment of this application can determine the amount of the damage to the first gate dielectric layer of the first MOS transistor 202 by testing the gate current of the first MOS transistor 202, thus determining whether the plasmas in the pattern etching of the selected metal layer are the source of the plasma damage to the gate dielectric layer. Therefore, this embodiment of this application can monitor whether the pattern etching of the selected metal layer will form the source of the plasma damage to the corresponding gate dielectric layer, thus locating the source of the plasma damage.

In this embodiment of this application, a plurality of testing substructures 201 may be further provided, so that each metal layer is provided with one corresponding testing substructure 201, thus monitoring whether each metal layer is a source of a plasma damage. Therefore, this embodiment of this application can quickly identify the metal layers which are sources of plasma damages from all metal layers.

In this embodiment of this application, a testing reference structure 201' may be further provided. A second pathway for accumulating the plasma charges towards a surface of the second dielectric layer in the testing reference structure 201' is a reference pathway without an antenna that cannot achieve amplification. The source of the plasma damage can be quickly located by comparing the gate current of the first MOS transistor 202 with the gate current of the second MOS transistor 202' of the testing reference structure 201'.

The testing structure in this embodiment of this application is composed of several discrete gates that connect the antenna structure that receives the plasma damage with transistors. Discrete gate leads belong to different metal layers. Source, drain and substrate leads of each transistor are shared. The discrete gates refer to the first gate conductive material layers 207 of the first MOS transistors 202, which are separated from each other.

A testing structure 301 adopted in a testing method for locating a source of a plasma damage provided in an embodiment of this application includes a testing substructure 201 corresponding to a selected metal layer.

The testing substructure 201 includes a first MOS transistor 202, a first gate lead 203, a first antenna 204 and a monitoring gate pad 205.

The first MOS transistor 202 includes a first gate structure, a first source area and a first drain area. The first gate structure includes a first gate dielectric layer and a first gate conductive material layer 207. In some embodiments, the first gate conductive material layer 207 is a poly gate or a metal gate.

The first MOS transistor 202 is formed in a corresponding active area 206. The first source area and the first drain area are self-aligned and formed in the active area 206 on two sides of the first gate conductive material layer 207.

The first gate lead 203 is composed of a metal wire of the selected metal layer.

The first antenna 204 is connected with the first gate lead 203.

In this embodiment of this application, all metal wires in the first antenna 204 are in a snakelike connection structure. In other embodiments, other suitable connection structures may also be adopted to form the first antenna 204.

The first gate lead 203 is connected with the first gate conductive material layer 207.

Plasmas are adopted in pattern etching of the selected metal layer. The first antenna 204, the first gate lead 203 and the first gate conductive material layer 207 form a first pathway for accumulating plasma charges towards a surface of the first gate dielectric layer in the pattern etching of the selected metal layer. The first pathway is an amplification pathway with the first antenna 204. The first antenna 204 is configured to increase absorption of the plasma charges and amplify the damage caused by the plasma charges to the first gate dielectric layer.

The monitoring gate pad 205 is connected with the first gate lead 203.

The testing method includes:

testing gate current of the first MOS transistor 202 through the monitoring gate pad 205; and monitoring the amount of the damage caused by the plasma charges in the pattern etching of the selected metal layer to the first gate dielectric layer by using the gate current of the first MOS transistor 202.

A top of the first gate conductive material layer 207 includes a plurality of metal layers. In an exemplary embodiment of this application, each metal layer is provided with one corresponding testing substructure 201, and the first gate leads 203 correspond to the metal layers one to one. In other embodiments, the metal layers that easily cause plasma damages may also be preliminarily selected, and the selected metal layers are only a part of all metal layers. A corresponding testing substructure 201 is provided for each selected metal layer, and no corresponding testing substructure 201 is provided for each unselected metal layer.

FIG. 3 illustrates the entire testing structure 301 according to this exemplary embodiment of this application. In FIG. 3, it includes n metal layers, which are sequentially marked as M1, M2, M3, M4 . . . Mn. Each metal layer is provided with one testing substructure 201. In FIG. 3, in an arrangement order of M1, M2, M3, M4 . . . Mn, n monitoring gate pads are sequentially marked as 2051, 2052, 2053, 2054 . . . 205n, and n first MOS transistors are sequentially marked as 2021, 2022, 2023, 2024 . . . 202n. In FIG. 3, there are n corresponding first gate leads 203 as illustrated in FIG. 2, which respectively correspond to the metal wires of the metal layers M1, M2, M3, M4 . . . Mn.

In FIG. 3, there are a total of n first antennas 204 as illustrated in FIG. 2 in a dashed box 302, each of which is connected with the first gate lead 203 of the corresponding metal layer. FIG. 3 shows that the n first antennas 204 are formed in the same area, i.e., the area as illustrated by the dashed box 302, but the n first antennas 204 are not located on the same metal layer. Therefore, in the cross-sectional structure, the n first antennas 204 are separate, that is, they are independent. Each first antenna 204 is composed of a metal wire of the selected metal layer. Similarly, the n first gate leads 203 described above are also independent of each other and correspond to the corresponding metal layers one to one. Only in this way can each testing substructure 201 correspond to one metal layer, so that each testing substructure 201 can test whether the plasma etching process of the corresponding metal layer is a source of a damage. In other embodiments, all first antennas 204 may also be not located in the same area. In this case, in some embodiments, each first antenna 204 is composed of a metal wire of the selected metal layer. In other embodiments, the first antenna 204 may also be formed by connecting the metal wire of the selected metal layer with the metal wires of a plurality of metal layers below the selected metal layer. The metal wires of the plurality of metal layers need to be connected through a via 212.

In an exemplary embodiment of this application, referring to FIG. 3, the testing structure further includes a testing reference structure 201'.

The testing reference structure 201' includes a second MOS transistor 202', a second gate lead 203' and a reference gate pad 205'. Compared with the testing substructure 201 in FIG. 2, the testing reference structure 201' is not provided with an antenna.

The second MOS transistor 202' includes a second gate structure, a second source area and a second drain area. The second gate structure includes a second gate dielectric layer and a second gate conductive material layer 207'.

The second MOS transistor 202' is formed in a corresponding active area 206. The first source area and the first drain area are self-aligned and formed in the active area 206 on two sides of the second gate conductive material layer 207'.

The second gate lead 203' is formed by connecting the metal wires of more than one metal layers. The second gate lead 203' is connected with the second gate conductive material layer 207'. In the pattern etching of each metal layer corresponding to the second gate lead 203', the second 203' gate lead and the first gate conductive material layer 207 form a second pathway for accumulating the plasma charges towards a surface of the second gate dielectric layer. The second pathway is a reference pathway without an antenna.

The reference gate pad 205' is connected with the second gate lead 203'.

Referring to FIG. 3, each first MOS transistor, i.e., each first MOS transistor corresponding to reference signs 2021, 2022, 2023, 2024 . . . 202n, and the second MOS transistor 202' are respectively formed in independent active areas 206. The active areas 206 of each first MOS transistor 202 and the second MOS transistor 202' are arranged in parallel and aligned. Length edges of the active areas 206 of each first MOS transistor 202 and the second MOS transistor 202' are in parallel and along a channel width direction.

Each first gate conductive material layer 207 and the second gate conductive material layer 207' are arranged in parallel. Each first gate lead 203 and the second gate lead 203' are arranged in parallel. From FIG. 3, it can be seen that the structure that the active area 206, each first gate conductive material layer 207 and the second gate conductive material layer 207 ', and each first gate lead 203 and the second gate lead 203' are arranged in parallel forms an array structure.

In some embodiments, referring to FIG. 3, each first gate lead 203 is provided with a first jumper 304. The first jumper 304 is located between a connecting end of the first antenna 204 and the first gate lead 203 and a connecting end of the monitoring gate pad 205 and the first gate lead 203.

The second gate lead 203' is provided with a second jumper 304'. The second jumper 304' is located between a connecting end of the second gate lead 203' and the second reference gate pad 205' and a connecting end of the second gate lead 203' and the second gate conductive material layer 207'.

In some embodiments, referring to FIG. 3, the first source area of each first MOS transistor 202 and the second source area of the second MOS transistor 202' are connected to the same source pad 209 through a source lead composed of a metal wire. In FIG. 3, the source lead is composed of the metal wire of the metal layer M1.

The first drain area of each first MOS transistor 202 and the second drain area of the second MOS transistor 202' are connected to the same drain pad 211 through a drain lead composed of a metal wire. In FIG. 3, the drain lead is composed of the metal wire of the metal layer M2.

A substrate electrode of each first MOS transistor 202 and a substrate electrode of the second MOS transistor 202' are connected to the same substrate pad 212 through a substrate electrode lead composed of a metal wire. In FIG. 3, each active area 206 is isolated on the semiconductor substrate through shallow trench isolation. FIG. 3 also illustrates another active area 206a adjacent to each active area 206. The other active area 206a is communicated with the active area 206. A contact or via 212 is formed in a top of the other active area 206a, which is connected with the substrate electrode lead and is finally connected to the substrate pad 212. In FIG. 3, the substrate electrode lead is composed of the metal wire of the metal layer M1.

In some embodiments, referring to FIG. 3, a first protective diode 305 is further provided on a path of each first gate lead 203. The first protective diode 305 is located between a connecting end of the monitoring gate pad 205 and the first gate lead 203 and a connecting end of connecting lines of the first gate lead 203 and the substrate pad 212.

A second protective diode 305' is further provided on a path of each second gate lead 203'. The second protective diode 305' is located between a connecting end of the reference gate pad 205' and the second gate lead 203' and a connecting end of connecting lines of the second gate lead 203' and the substrate pad 212.

Referring to FIG. 4, which illustrates a schematic structural diagram of arrangement of pads of a testing structure 301 for locating a source of a plasma damage according to an embodiment of this application, each monitoring gate pad 205, the source pad 209, the drain pad 211, the substrate pad 212 and the reference gate pad 205' are arranged in the same row. FIG. 4 also illustrates that the first antennas 204 corresponding to the testing substructures 201 are separately provided in different areas. In FIG. 4, box 401 represents an array structure formed by arranging the first MOS transistor 202 and the first gate lead 203 corresponding to each testing substructure 201 in FIG. 3, and the second MOS transistor 202' and the second gate lead 203' of the testing reference structure 201'. From FIG. 4, it can be seen that during testing, it is only necessary to add appropriate electrical signals to the corresponding pads and read the corresponding electrical signals.

In an exemplary embodiment of this application, the testing method further includes:

testing gate current of the second MOS transistor 205' through the reference gate pad 202'; and monitoring the amount of the damage caused by the plasma charges in the pattern etching of the selected metal layer to the first gate dielectric layer by comparing the gate current of the first MOS transistor 202 of the selected metal layer with the gate current of the second MOS transistor 202'.

In some cases, in the testing method, the step of comparing the gate current of the first MOS transistor 202 of the selected metal layer with the gate current of the second MOS transistor 202' includes:

calculating a first ratio of the gate current of the first MOS transistor 202 of the selected metal layer to the gate current of the second MOS transistor 202'. The first ratio is used for monitoring the amount of the damage caused by the plasma charges in the pattern etching of the selected metal layer to the first gate dielectric layer. The larger the first ratio, the greater the amount of the damage caused by the plasma charges in the pattern etching of the selected metal layer to the first gate dielectric layer.

For example, if the gate currents of the first MOS transistors 202 measured on the n monitoring gate pads marked as 2051, 2052, 2053, 2054 . . . 205n are I1, I2 . . . In, and the gate current of the second MOS transistor 202' measured on the reference gate pad 205' is I0, then the first ratios are I1/I0, I2/I0 . . . In/I0, respectively. The first ratio is a plasma damage parameter. The larger the ratio, the more severe the plasma damage.

This application has been described above in detail through specific embodiments, which, however, do not constitute limitations to this application. Without departing from the principle of this application, those skilled in the art can also make many modifications and improvements, which should also be considered as included in the scope of protection of this application.

What is claimed is:

1. A testing structure for locating a source of a plasma damage, comprising a testing substructure corresponding to a selected metal layer;

the testing substructure comprising a first MOS transistor, a first gate lead, a first antenna and a monitoring gate pad;

the first MOS transistor comprising a first gate structure, a first source area and a first drain area, the first gate structure comprising a first gate dielectric layer and a first gate conductive material layer;

the first gate lead being composed of a metal wire of the selected metal layer;

the first antenna being connected with the first gate lead;

the first gate lead being connected with the first gate conductive material layer;

plasmas being adopted in pattern etching of the selected metal layer, the first antenna, the first gate lead and the first gate conductive material layer forming a first pathway for accumulating plasma charges towards a surface of the first gate dielectric layer in the pattern etching of the selected metal layer, the first antenna being configured to increase absorption of the plasma charges and amplify the damage caused by the plasma charges to the first gate dielectric layer;

the monitoring gate pad being connected with the first gate lead, the monitoring gate pad being configured to test gate current of the first MOS transistor, the gate current of the first MOS transistor being used for monitoring the amount of the damage caused by the plasma charges in the pattern etching of the selected metal layer to the first gate dielectric layer.

2. The testing structure for locating the source of the plasma damage according to claim 1, wherein a top of the first gate conductive material layer comprises a plurality of metal layers, each metal layer is provided with one corresponding testing substructure, and the first gate leads correspond to the metal layers one to one.

3. The testing structure for locating the source of the plasma damage according to claim 2, wherein in the testing substructure corresponding to the selected metal layer, the first antenna is composed of the metal wire of the selected metal layer, or the first antenna is formed by connecting the metal wire of the selected metal layer with the metal wires of a plurality of metal layers below the selected metal layer.

4. The testing structure for locating the source of the plasma damage according to claim 3, wherein in the testing substructure corresponding to the selected metal layer, all metal wires in the first antenna are in a snakelike connection structure.

5. The testing structure for locating the source of the plasma damage according to claim 2, wherein the testing structure further comprises a testing reference structure;

the testing reference structure comprises a second MOS transistor, a second gate lead and a reference gate pad;

the second MOS transistor comprises a second gate structure, a second source area and a second drain area, and the second gate structure comprises a second gate dielectric layer and a second gate conductive material layer;

the second gate lead is formed by connecting the metal wires of more than one metal layers, and the second gate lead is connected with the second gate conductive material layer; in the pattern etching of each metal layer corresponding to the second gate lead, the second gate lead and the first gate conductive material layer form a second pathway for accumulating the plasma charges towards a surface of the second gate dielectric layer, and the second pathway is a reference pathway without an antenna;

the reference gate pad is connected with the second gate lead, and the reference gate pad is configured to test gate current of the second MOS transistor; the gate current of the second MOS transistor is used for being compared with the gate current of the first MOS transistor of the selected metal layer to monitor the amount of the damage caused by the plasma charges in the pattern etching of the selected metal layer to the first gate dielectric layer.

6. The testing structure for locating the source of the plasma damage according to claim 5, wherein the gate current of the first MOS transistor of the selected metal layer and the gate current of the second MOS transistor are used for calculating a first ratio, the first ratio is a ratio of the gate current of the first MOS transistor of the selected metal layer to the gate current of the second MOS transistor, the first ratio is used for monitoring the amount of the damage caused by the plasma charges in the pattern etching of the selected metal layer to the first gate dielectric layer, and the larger the first ratio, the greater the amount of the damage caused by the plasma charges in the pattern etching of the selected metal layer to the first gate dielectric layer.

7. The testing structure for locating the source of the plasma damage according to claim 5, wherein each first MOS transistor and the second MOS transistor are respectively formed in independent active areas;

the active areas of each first MOS transistor and the second MOS transistor are arranged in parallel and aligned, and length edges of the active areas of each first MOS transistor and the second MOS transistor are in parallel and along a channel width direction;

each first gate conductive material layer and the second gate conductive material layer are arranged in parallel, and each first gate lead and the second gate lead are arranged in parallel;

each first gate lead is provided with a first jumper, and the first jumper is located between a connecting end of the first antenna and the first gate lead and a connecting end of the monitoring gate pad and the first gate lead;

the second gate lead is provided with a second jumper, and the second jumper is located between a connecting end of the second gate lead and the second reference gate pad and a connecting end of the second gate lead and the second gate conductive material layer.

8. The testing structure for locating the source of the plasma damage according to claim 7, wherein the first source area of each first MOS transistor and the second source area of the second MOS transistor are connected to the same source pad through a source lead composed of a metal wires the first drain area of each first MOS transistor and the second drain area of the second MOS transistor are connected to the same drain pad through a drain lead composed of a metal wire;

a substrate electrode of each first MOS transistor and a substrate electrode of the second MOS transistor are connected to the same substrate pad through a substrate electrode lead composed of a metal wire;

a first protective diode is further provided on a path of each first gate lead, and the first protective diode is located between a connecting end of the monitoring gate pad and the first gate lead and a connecting end of connecting lines of the first gate lead and the substrate pad;

a second protective diode is further provided on a path of each second gate lead, and the second protective diode is located between a connecting end of the reference gate pad and the second gate lead and a connecting end of connecting lines of the second gate lead and the substrate pad.

9. The testing structure for locating the source of the plasma damage according to claim 8, wherein each monitoring gate pad, the source pad, the drain pad, the substrate pad and the reference gate pad are arranged in the same row.

10. A testing method for locating a source of a plasma damage, a testing structure adopted in the testing method comprising a testing substructure corresponding to a selected metal layer;

the testing substructure comprising a first MOS transistor, a first gate lead, a first antenna and a monitoring gate pad;

the first MOS transistor comprising a first gate structure, a first source area and a first drain area, the first gate structure comprising a first gate dielectric layer and a first gate conductive material layer;

the first gate lead being composed of a metal wire of the selected metal layer;

the first antenna being connected with the first gate lead;

the first gate lead being connected with the first gate conductive material layer;

plasmas being adopted in pattern etching of the selected metal layer, the first antenna, the first gate lead and the first gate conductive material layer forming a first pathway for accumulating plasma charges towards a surface of the first gate dielectric layer in the pattern etching of the selected metal layer, the first antenna being configured to increase absorption of the plasma charges and amplify the damage caused by the plasma charges to the first gate dielectric layer;

the monitoring gate pad being connected with the first gate lead;

the testing method comprising:

testing gate current of the first MOS transistor through the monitoring gate pad; and monitoring the amount of the damage caused by the plasma charges in the pattern etching of the selected metal layer to the first gate dielectric layer by using the gate current of the first MOS transistor.

11. The testing method for locating the source of the plasma damage according to claim 10, wherein a top of the first gate conductive material layer comprises a plurality of metal layers, each metal layer is provided with one corresponding testing substructure, and the first gate leads correspond to the metal layers one to one.

12. The testing method for locating the source of the plasma damage according to claim 11, wherein in the testing substructure corresponding to the selected metal layer, the first antenna is composed of the metal wire of the selected metal layer, or the first antenna is formed by connecting the metal wire of the selected metal layer with the metal wires of a plurality of metal layers below the selected metal layer.

13. The testing method for locating the source of the plasma damage according to claim 12, wherein in the testing substructure corresponding to the selected metal layer, all metal wires in the first antenna are in a snakelike connection structure.

14. The testing method for locating the source of the plasma damage according to claim 11, wherein the testing structure further comprises a testing reference structure;

the testing reference structure comprises a second MOS transistor, a second gate lead and a reference gate pad;

the second MOS transistor comprises a second gate structure, a second source area and a second drain area, and the second gate structure comprises a second gate dielectric layer and a second gate conductive material layer;

the second gate lead is formed by connecting the metal wires of more than one metal layers, and the second gate lead is connected with the second gate conductive material layer; in the pattern etching of each metal layer corresponding to the second gate lead, the second gate lead and the first gate conductive material layer form a second pathway for accumulating the plasma charges towards a surface of the second gate dielectric layer, and the second pathway is a reference pathway without an antenna;

the reference gate pad is connected with the second gate lead;

the testing method comprises:

testing gate current of the second MOS transistor through the reference gate pad; and monitoring the amount of the damage caused by the plasma charges in the pattern etching of the selected metal layer to the first gate dielectric layer by comparing the gate current of the first MOS transistor of the selected metal layer with the gate current of the second MOS transistor.

15. The testing method for locating the source of the plasma damage according to claim 14, wherein in the testing method, the step of comparing the gate current of the first MOS transistor of the selected metal layer with the gate current of the second MOS transistor comprises:

calculating a first ratio of the gate current of the first MOS transistor of the selected metal layer to the gate current of the second MOS transistor, the first ratio being used for monitoring the amount of the damage caused by the plasma charges in the pattern etching of the selected metal layer to the first gate dielectric layer, the larger the first ratio, the greater the amount of the damage caused by the plasma charges in the pattern etching of the selected metal layer to the first gate dielectric layer.

16. The testing method for locating the source of the plasma damage according to claim 14, wherein each first MOS transistor and the second MOS transistor are respectively formed in independent active areas;

the active areas of each first MOS transistor and the second MOS transistor are arranged in parallel and aligned, and length edges of the active areas of each first MOS transistor and the second MOS transistor are in parallel and along a channel width direction;

each first gate conductive material layer and the second gate conductive material layer are arranged in parallel, and each first gate lead and the second gate lead are arranged in parallel;

each first gate lead is provided with a first jumper, and the first jumper is located between a connecting end of the first antenna and the first gate lead and a connecting end of the monitoring gate pad and the first gate lead;

the second gate lead is provided with a second jumper, and the second jumper is located between a connecting end of the second gate lead and the second reference gate pad and a connecting end of the second gate lead and the second gate conductive material layer.

17. The testing method for locating the source of the plasma damage according to claim 16, wherein the first source area of each first MOS transistor and the second source area of the second MOS transistor are connected to the same source pad through a source lead composed of a metal wire;

the first drain area of each first MOS transistor and the second drain area of the second MOS transistor are connected to the same drain pad through a drain lead composed of a metal wire;

a substrate electrode of each first MOS transistor and a substrate electrode of the second MOS transistor are connected to the same substrate pad through a substrate electrode lead composed of a metal wire;

a first protective diode is further provided on a path of each first gate lead, and the first protective diode is located between a connecting end of the monitoring gate pad and the first gate lead and a connecting end of connecting lines of the first gate lead and the substrate pad;

a second protective diode is further provided on a path of each second gate lead, and the second protective diode is located between a connecting end of the reference gate pad and the second gate lead and a connecting end of connecting lines of the second gate lead and the substrate pad;

each monitoring gate pad, the source pad, the drain pad, the substrate pad and the reference gate pad are arranged in the same row.

\* \* \* \* \*